(12) United States Patent
Ichitsubo et al.

(10) Patent No.: US 7,741,904 B2
(45) Date of Patent: Jun. 22, 2010

(54) EFFICIENT INTEGRATED LINEAR AMPLIFIER MODULE

(75) Inventors: Ikuroh Ichitsubo, Sagamihara (JP); Masaya Kuwano, Sagamihara (JP); Koshiro Matsumoto, Tokyo (JP)

(73) Assignee: Micro Mobio Corporation, Palo Alto, CA (US)

( * ) Notice: Subject to any disclaimer, the term of this patent is extended or adjusted under 35 U.S.C. 154(b) by 76 days.

(21) Appl. No.: 12/013,734

(22) Filed: Jan. 14, 2008

(65) Prior Publication Data

US 2009/0179698 A1 Jul. 16, 2009

(51) Int. Cl.
*H03G 5/16* (2006.01)
(52) U.S. Cl. ........................ 330/133; 330/310
(58) Field of Classification Search ................ 330/133, 330/98, 150, 124 R, 285, 310
See application file for complete search history.

(56) References Cited

U.S. PATENT DOCUMENTS

| 4,977,041 | A | 12/1990 | Shiozawa |
| 5,656,972 | A | 8/1997 | Norimatsu |
| 5,880,635 | A | 3/1999 | Satoh |
| 6,025,651 | A | 2/2000 | Nam |
| 6,151,509 | A | 11/2000 | Chorey |
| 6,262,630 | B1 | 7/2001 | Eriksson |
| 6,462,622 | B1 | 10/2002 | Mori |
| 6,625,050 | B2 | 9/2003 | Suwa |
| 6,678,506 | B1 | 1/2004 | Dolman |
| 6,798,287 | B2 | 9/2004 | Wu |
| 7,157,966 | B2 * | 1/2007 | Baree et al. .................. 330/133 |
| 7,444,124 | B1 * | 10/2008 | Loeb et al. ............... 455/127.3 |
| 2004/0127185 | A1 | 7/2004 | Abrahams |
| 2004/0203552 | A1 | 10/2004 | Horiuchi |
| 2005/0239415 | A1 | 10/2005 | Sagae |
| 2008/0218270 | A1 * | 9/2008 | Hau et al. ................... 330/289 |

* cited by examiner

*Primary Examiner*—Robert Pascal
*Assistant Examiner*—Hieu P Nguyen
(74) *Attorney, Agent, or Firm*—Xin Wen (57) ABSTRACT

A linear amplifier circuit includes a first matching circuit that receives a first signal and to produce a first impedance matched signal, a first power amplifier that produces a first amplified signal in response to the first impedance matched signal under the control of a first bias signal, a second power amplifier that produces a second amplified signal in response to the first impedance matched signal under the control of a second bias signal, a biasing circuit that produces the first bias signal and the second bias signal. The first power amplifier can be activated by the first biasing signal when the power of the output signal is to exceed a first threshold value. The second power amplifier can be activated by the second biasing signal when the power of the output signal is below a second threshold value. A second matching circuit configured to receive the first amplified signal and the second amplified signal, and to produce an output signal.

10 Claims, 9 Drawing Sheets

EFFICIENT INTEGRATED LINEAR AMPLIFIER MODULE

BACKGROUND

The present invention relates to radio frequency power amplifiers.

Portable devices such as laptop personal computers. Personal Digital Assistant (PDA) and cellular phones with wireless communication capability are being developed in ever decreasing size for convenience of use. Correspondingly, the electrical components thereof must also decrease in size while still providing effective radio transmission performance. However, the substantially high transmission power associated with radio frequency (RF) communication increases the difficulty of miniaturization of the transmission components.

A major component of a wireless communication device is the power amplifiers (PA). A PA can he fabricated on a semiconductor integrated circuit (IC) chip to provide signal amplification with substantial power. The power amplifier chip can be interconnected with certain off-chip components such as inductors, capacitors, resistors, and transmission lines for operation controls and for providing impedance matching to the input and output RF signals.

One significant challenge for power amplifiers is power consumption. As RF devices are used in longer distances and broader frequencies, the RF devices can consume power at increased rates. Batteries of the RF devices often need to be frequently recharged. Several attempts have been made to improve power amplifiers' power consumption. A power amplifier using so called "Doherty Technique" includes a plurality of serially connected power amplifiers. Another attempt utilizes a number of power amplifiers arranged in a parallel circuit. Another design attempts to reduce power amplifiers' power consumption using quadrature balanced amplifiers. These designs, however, usually cannot provide high quality signals in a wide output power range and a wide frequency range.

SUMMARY

In a general aspect, the present invention relates to a linear amplifier circuit includes a first matching circuit that receives a first signal and to produce a first impedance matched signal, a first power amplifier that produces a first amplified signal in response to the first impedance matched signal under the control of a first bias signal, a second power amplifier that can produce a second amplified signal in response to the first impedance matched signal under the control of a second bias signal, a biasing circuit that can produce the first bias signal and the second bias signal. The first power amplifier can be activated by the first biasing signal when the power of the output signal is to exceed a first threshold value. The second power amplifier can be activated by the second biasing signal when the power of the output signal is below a second threshold value. A second matching circuit configured to receive the first amplified signal and the second amplified signal, and to produce an output signal.

In another general aspect, the present invention relates to a linear amplifier circuit that includes a power divider that can receive a first signal and to produce a first power divided signal and a second power divided signal; a first matching circuit that can receive the first power divided signal and to produce a first impedance matched signal; a second matching circuit that receives the second power divided signal and to produce a second impedance matched signal; a first power amplifier coupled to the first matching circuit, wherein the first power amplifier can produce a first amplified signal in response to the first impedance matched signal under the control of a first bias signal; a second power amplifier coupled to the second matching circuit, wherein the second power amplifier can produce a second amplified signal in response to the first impedance matched signal under the control of a second bias signal; a biasing circuit can produce the first bias signal and the second bias signal, wherein the first power amplifier can be activated by the first biasing signal when the power of the output signal is to exceed a first threshold value, wherein the second power amplifier can be activated by the second biasing signal when the power of the output signal is below a second threshold value; a third matching circuit that can receive the first amplified signal and to produce a third impedance matched signal; and a fourth matching circuit that can receive the second amplified signal and to produce a fourth impedance matched signal.

In yet another general aspect, the present invention relates to an integrated linear power amplifier module that includes a linear amplifier circuit and a power sensing circuit. The linear amplifier circuit includes one or more first matching circuits that can produce one or more first impedance matched signals in response to a first signal; a first power amplifier that can produce a first amplified signal in response to at least one of the first impedance matched signals under the control of a first bias signal; a second power amplifier coupled to produce a second amplified signal in response to at least one of the first impedance matched signals under the control of a second bias signal; a biasing circuit that can produce the first bias signal and the second bias signal, wherein the first power amplifier can be activated by the first biasing signal when the power of the output signal is to exceed a first threshold value, wherein the second power amplifier can be activated by the second biasing signal when the power of the output signal is below a second threshold value; and one or more second matching circuits that can receive the first amplified signal and the second amplified signal, and to produce an output signal; and a power sensing circuit that can produce a power sensing signal in response to the power of the output signal, wherein the biasing circuit can produce the first bias signal and the second bias signal in response to the power sensing signal.

In yet another general aspect, the present invention relates to a linear amplifier circuit that includes a power driver configured to amplify an input signal to produce a first signal; a first power amplifier configured to produce a first amplified signal in response to the first signal under the control of a first bias signal; a gain control circuit in communication with the power driver, wherein the gain control circuit is configured to control gain variation of the first power amplifier and the second power amplifier; and a phase control circuit in communication with the power driver, wherein the phase control circuit is configured to compensate for phase variation of the first power amplifier and the second power amplifier.

Implementations of the system may include one or more of the following. The first bias signal can activate the first power amplifier when the power of the output signal is to exceed the first threshold value and to deactivate the first power amplifier when the power of the output signal is below the first threshold value. The biasing circuit can produce the first bias signal and the second bias signal in accordance to the power of the output signal. The linear amplifier circuit can further include a third power amplifier coupled to the first matching circuit, wherein the third power amplifier can produce a third amplified signal in response to the first impedance matched signal under the control of a third bias signal received from the biasing circuit. The first power amplifier can be activated when the power of the output signal is below a third threshold level lower than the second threshold value. The linear amplifier circuit can further include a power sensing circuit configured to measure the power of the output signal and to send a power sensing signal to the biasing circuit. The first power amplifier and the second power amplifier can be connected in a parallel circuit. The linear amplifier circuit can further include a third matching circuit configured to receive an input signal and to produce a second matched impedance in response to the input signal; and a power driver configured to amplify the second impedance matched signal to produce the first signal. The linear amplifier circuit can further include a gain control circuit in communication with the power driver, where in the gain control circuit can control gain variation of the first power amplifier and the second power amplifier. The linear amplifier circuit can further include a phase control circuit in communication with the power driver, where in the phase control circuit can compensate for phase variation of the first power amplifier and the second power amplifier.

Embodiments may include one or more of the following advantages. The disclosed linear amplifier circuits can provide low power consumption. The power level of the RF transmission can be properly controlled to minimize power consumption while providing superior signal quality such as gain linearity. The disclosed linear amplifier circuits can provide excellent output linearity and low harmonies over a wide range of radio frequencies. The high linearity and low harmonics allow high transmission data density in a fixed bandwidth (i.e. higher bits per Hertz). The disclosed linear amplifier circuits can significantly improve the performance of Adjacent Channel Power Ratio (ACPR) and spectrum mask.

The disclosed linear amplifier circuits are suitable to applications in various wireless data and voice communications standards and protocols, including Orthogonal Frequency-Division Multiplexing (OFDM), Orthogonal Frequency-Division Multiplexing Access (OFDMA), Code Division Multiple Access (CDMA), Wideband Code Division Multiple Access (WCDMA), High-Speed Downlink Packet Access (HSDPA), High-Speed Packet Access (HSPA), Ultra Mobile Broadband (UMB), Long Term Evolution (LTE), WiMax, WiBro, WiFi, WLAN, 802.16, EVM, and others. The linear amplifier circuits are also suitable for high frequency operations by utilizing Gallium Arsenide Heterojunction Bipolar Transistors (GaAs HBT).

The disclosed linear amplifier circuits can minimize power consumption in accordance with the output power probability distribution specific to the application of the wireless devices. The disclosed linear amplifier circuit can reduce power consumption by using application specificity, dynamic control, and real time feedback. Power consumption can thus be drastically improved comparing to convention power amplifiers.

The disclosed linear amplifier circuits can also provide proper impedance matching for the input and output signals, as well as for the signals at different stages of the amplification. A power amplifier typically operates with high current flowing through the linear amplifier circuit. A non-zero impedance in the circuit can easily induce a voltage, which can inject unwanted noise into the RF system. The disclosed linear amplifier circuits can therefore minimize noise from unwanted signal oscillations.

Another advantage of the disclosed linear amplifier circuits is that the components involved are highly integrated. One or more of the impedance matching circuits, biasing circuit, power division and power combining circuits, Vmode control circuit, power sensing circuit, and power control circuit can be integrated in a single IC chip. The disclosed linear power amplifier module can therefore be compact and has smaller foot print compared to prior art implementations. Bulky components such as switches in some conventional systems are not eliminated in the disclosed PA circuits.

BRIEF DESCRIPTION OF THE DRAWINGS

The following drawings, which are incorporated in and from a part of the specification, illustrate embodiments of the present specification and, together with the description, serve to explain the principles of the specification.

DETAILED DESCRIPTION

Figure 1:
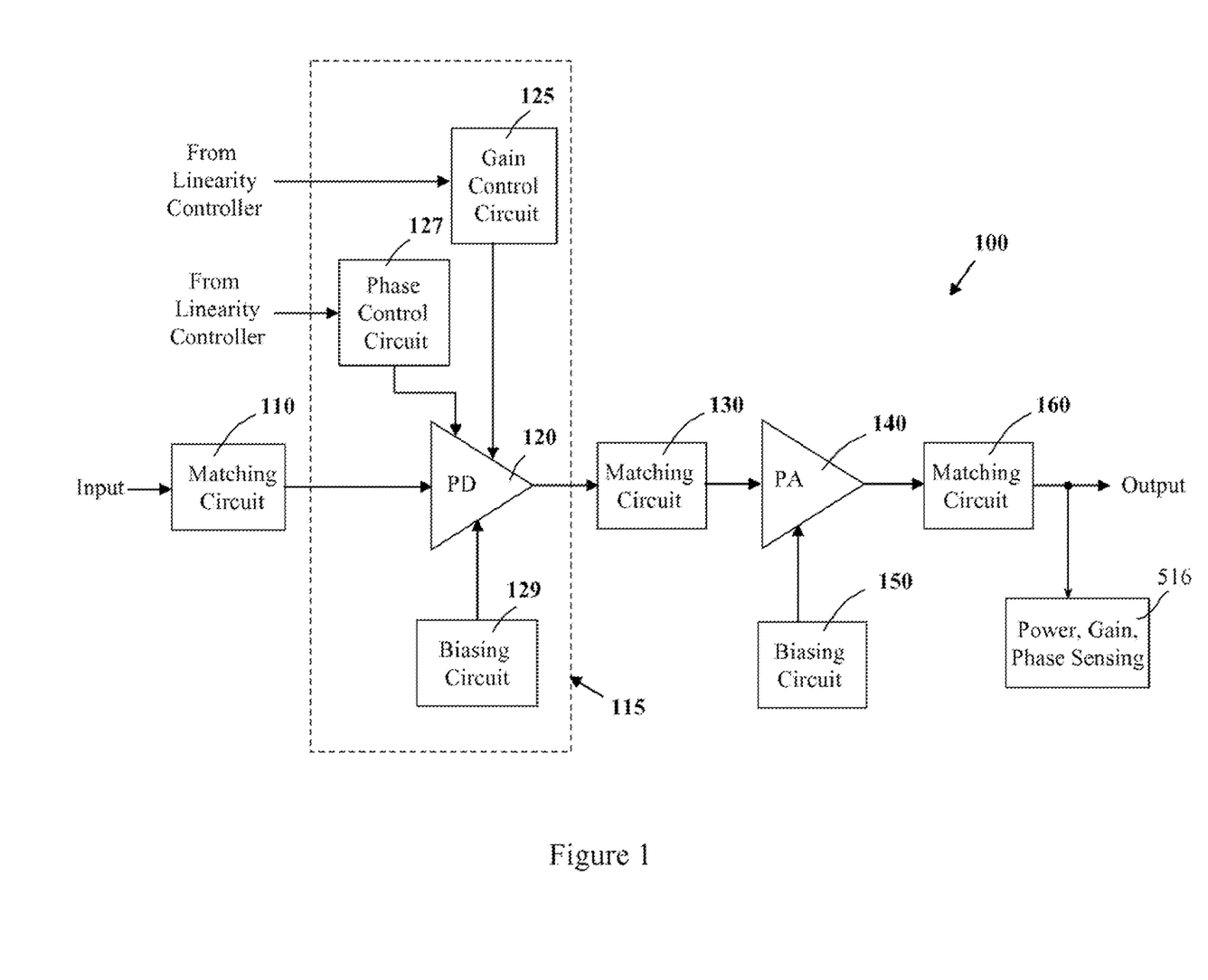
FIG. 1 is a schematic diagram for a linear amplifier circuit in accordance with the present specification.

A power amplifier circuit 100, referring to FIG. 1, includes a matching circuit 110 and a power driving stage 115 that includes a power driver (PD) 120, a gain control circuit 125, and a phase control circuit 127. The gain control circuit 125 and the phase control circuit 127 can respectively provide gain and phase controls to the power driver 120. The gain control circuit 125 and the phase control circuit 127 receive control signals from a linearity controller that can be a base band processor (520 in FIG. 7 below) or a dedicated linearity control circuit. The power amplifier circuit 100 also includes a matching circuit 130, a power amplifier (PA) 140, and a matching circuit 160. The bias of the power amplifier 140 is under the control of a biasing circuit 150. The matching circuit 110 can receive an input RF signal. The matching circuit 110 can match the input impedance to the impedance of the device that provides the input signal and send an impedance matched signal to the power driver 120. The power driver 120 is biased by a biasing circuit 129 that can be internal in the power driver 120. The power driver 120 can amplify the signal from the matching circuit 110 and send a first amplified signal to the matching circuit 130. The matching circuit 130 can match the impedance of the first amplified signal and send an impedance matched signal to the power amplifier 140 that can generate a second amplified signal. The matching circuit 160 can match the impedance of the second amplified signal and produce an output signal. As discussed below in relation to FIG. 7 and a wireless communication device 500, a sensing circuit 516 can receive the output signal from the matching circuit 160, which can detect the power, the gain, and the phase of the output signal for linearity control. As discussed below in relation with FIGS. 6A and 6B, the gain control circuit 127 can improve gain linearity by compensating the gain expansion and compression between the power driver 120 and the subsequent power amplifier 140. The phase control circuit 125 can correct or compensate for phase variations over a range of the output power.

Figure 2:
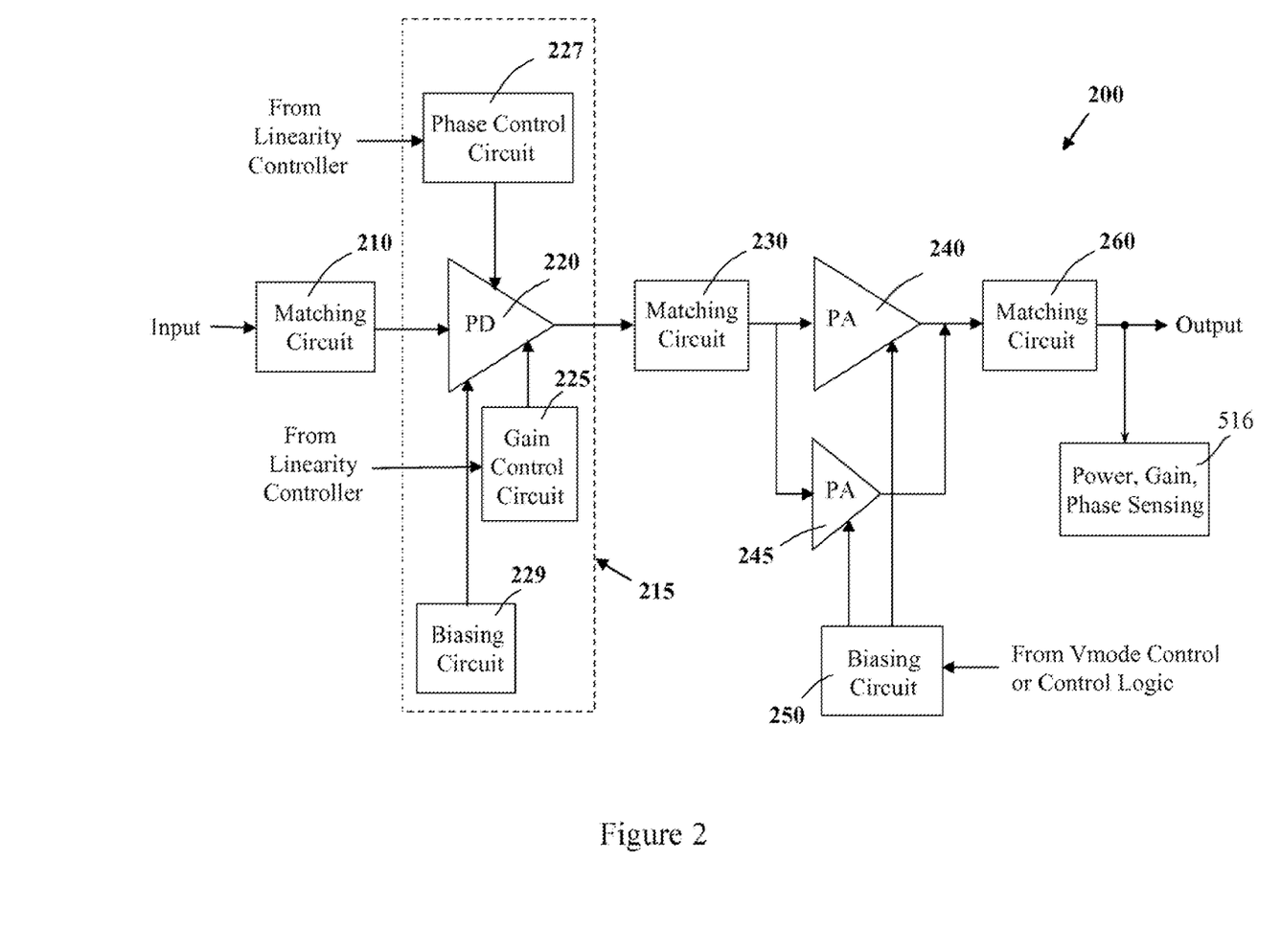
FIG. 2 is a schematic diagram for a linear amplifier circuit in accordance with the present specification.

In some embodiments, referring to FIG. 2, a linear amplifier circuit 200 includes a matching circuit 210 for the input signal and a power driving stage 215 that includes a power driver (PD) 220, a gain control circuit 225, and a phase control circuit 227. The gain control circuit 225 and the phase control circuit 227 receive control signals from a linearity controller that can be a base band processor (520 in FIG. 7 below) or a dedicated linearity control circuit. The gain control circuit 225 and the phase control circuit 227 can respectively provide gain and phase controls to the power driver 220. The power driver 220 is biased by a biasing circuit 229 that can be internal in the power driver 220. The linear amplifier circuit 200 also includes a matching circuit 230 for a first amplified signal from the power driver 220, and a matching circuit 260 for the output signal. As discussed below in relation to FIG. 7 and a wireless communication device 500, a sensing circuit 516 can receive the output signal from the matching circuit 260, which can detect the power, the gain, and the phase of the output signal for linearity control.

The linear amplifier circuit 200 also includes a main power amplifier 240 and an auxiliary power amplifier 245 which can be arranged in a parallel circuit. As discussed below in relation with FIGS. 6A and 6B, the gain control circuit 227 can improve gain linearity by compensating the gain expansion and compression between the power driver 220 and the main power amplifier 240 and the auxiliary power amplifier 245. The phase control circuit 225 can correct or compensate for phase variations over a range of the output power.

A biasing circuit 250 can provide bias voltages the main power amplifier 240 and the auxiliary power amplifier 245. The biasing circuit 250 can produce a first bias signal for the main power amplifier 240 and a second bias signal for the auxiliary power amplifier 245. The main power amplifier 240 and the auxiliary power amplifier 245 can thus be activated separately to optimize the performances (power consumption, gain linearity, noise reduction, etc.) of the wireless communication device. The biasing circuit 250 can activate the main power amplifier 240 when the power of the output signal is to exceed a first threshold value. The biasing circuit 250 can deactivate the main power amplifier 240 when the power of the output signal is to be below a first threshold value. The auxiliary power amplifier 245 can be activated by the biasing circuit 250 at least when the power of the output signal is below a second threshold value. Optionally, the auxiliary power amplifier 245 can be activated by the biasing circuit 250 when the power of the output signal is to exceed the second threshold value. The first threshold value can be the substantially the same or below the second threshold value. As described below in more detail in relation to FIG. 7, the biasing circuit 250 can be controlled by a control logic circuit and/or a Vmode control circuit. The controls can be based on the power of the output RF signal as measured by a power sensing circuit. The controls can also be determined by a base band processor (520).

The matching circuit 210 can match the impedance of the input RF signal and send an impedance matched signal to the first-stage power driver 220. The power driver 220 can amplify the signal from the matching circuit 210 and send a first amplified signal to the matching circuit 230. The matching circuit 230 can match the impedance of the first amplified signal and send impedance matched signals to the main power amplifier 240 and the auxiliary power amplifier 245. The main power amplifier 240 and the auxiliary power amplifier 245, as described below, can coordinate the amplification tasks to produce amplified signals to be sent to the matching circuit 260. The matching circuit 260 can match the impedance of the amplified signals from the main power amplifier 240 and the auxiliary power amplifier 245 and produce an output signal. The impedance matching of the input and output signals is preferably based on the 50-ohm standard of the RF industry. Other details of impedance matching circuits are described commonly assigned U.S. patent application Ser. No. 10/041,863, filed on Oct. 22, 2001, titled "Multilayer RF Amplifier Module", by Wang, et al., the content of which is incorporated by reference.

An advantage of the improved and efficient linear amplifier circuit 200 is that the intermediate amplified RF signal from the first-stage power driver 220 is impedance matched by the matching circuit 230 before it is received by the main power amplifier 240 and the auxiliary power amplifier 245. Since the main power amplifier 240 and the auxiliary power amplifier 245 can operate with high current flowing, non-zero impedance can induce can inject unwanted voltage noise during the intermediate amplification steps in the linear amplifier circuit. The impedance matching for the intermediate signals can therefore significantly minimize noise and unwanted signal oscillations.

It should be noted that the main power amplifier 240 or the auxiliary power amplifier 245 can include multiple stages of amplifiers. Moreover, the power amplifier module 200 can include more than one auxiliary power amplifiers 245. For example, the power amplifier module 200 can include two or three auxiliary power amplifiers that are connected in parallel with the main power amplifier. The different auxiliary power amplifiers can be activated at and below different threshold power levels of the output signal. For example, the power of the output signals may include three contiguous ranges that the main power amplifier and two auxiliary power amplifiers are responsible for amplifying from the high power rage to the low power range. In some embodiments, the power amplifier module 200 is fabricated on an integrated circuit (IC) module that can be implemented on a single semiconductor chip.

Figure 3:
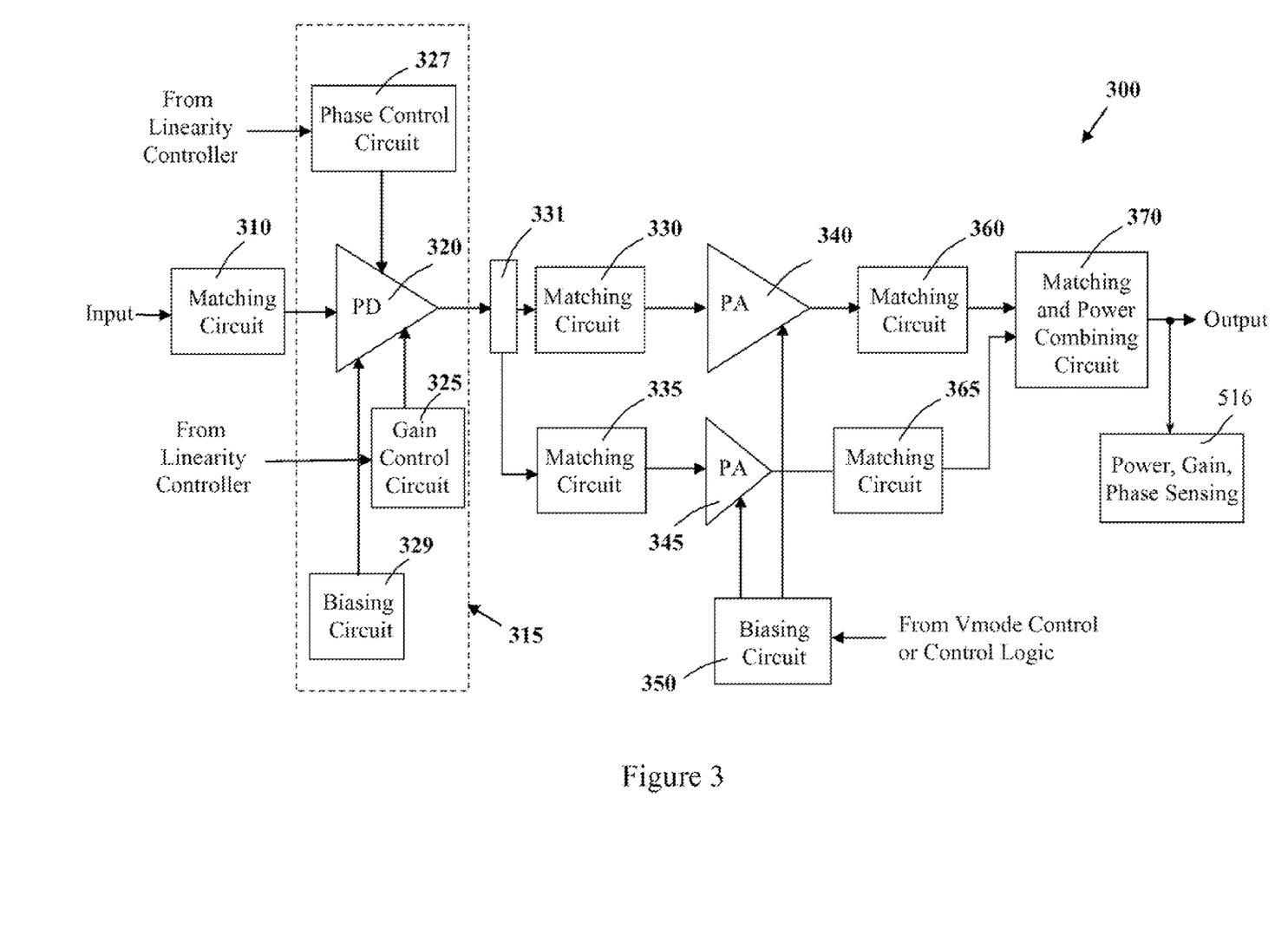
FIG. 3 is a schematic diagram for another linear amplifier circuit in accordance with the present specification.
Figure 4:
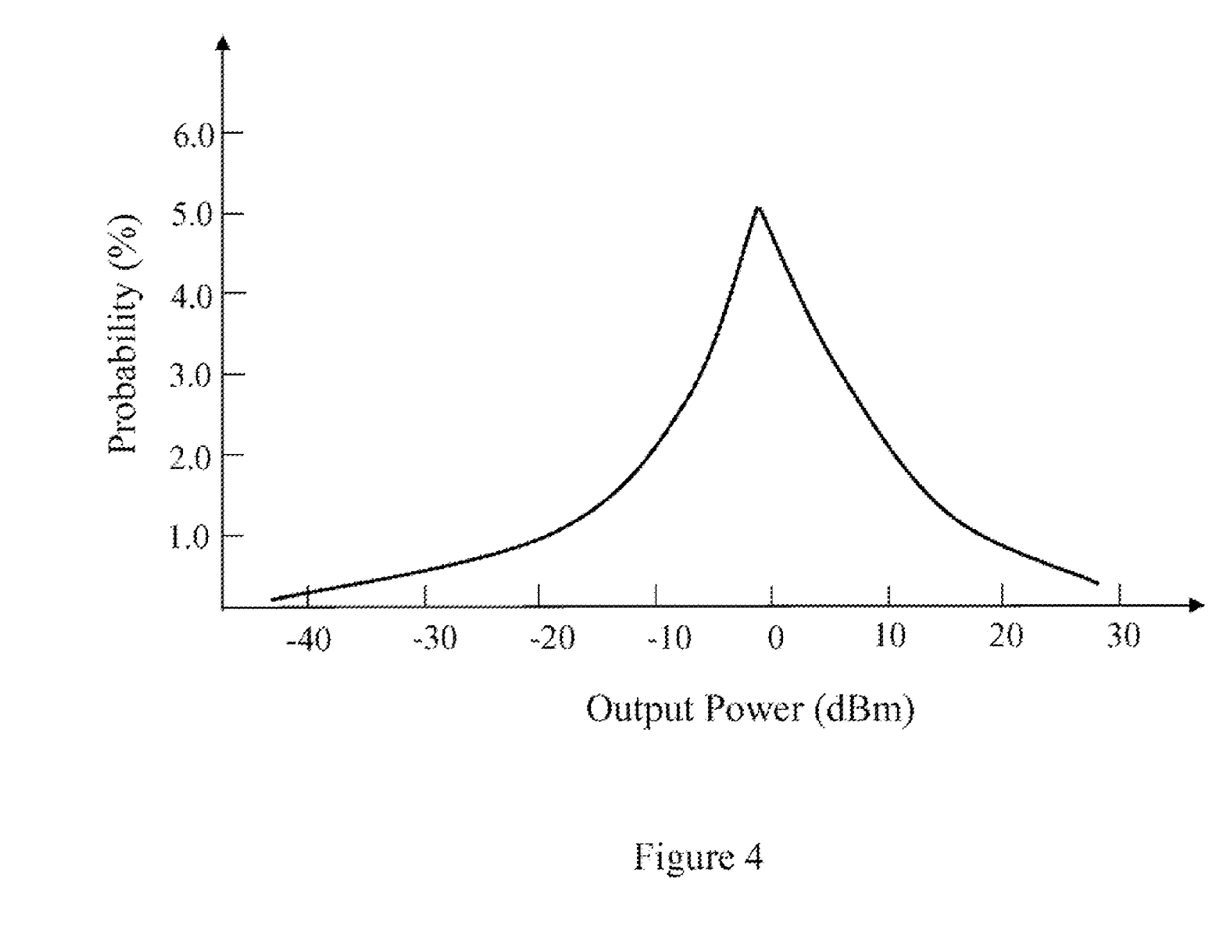
FIG. 4 shows an exemplified probability distribution for output power of a wireless communication protocol in a geographic environment.
Figure 5A:
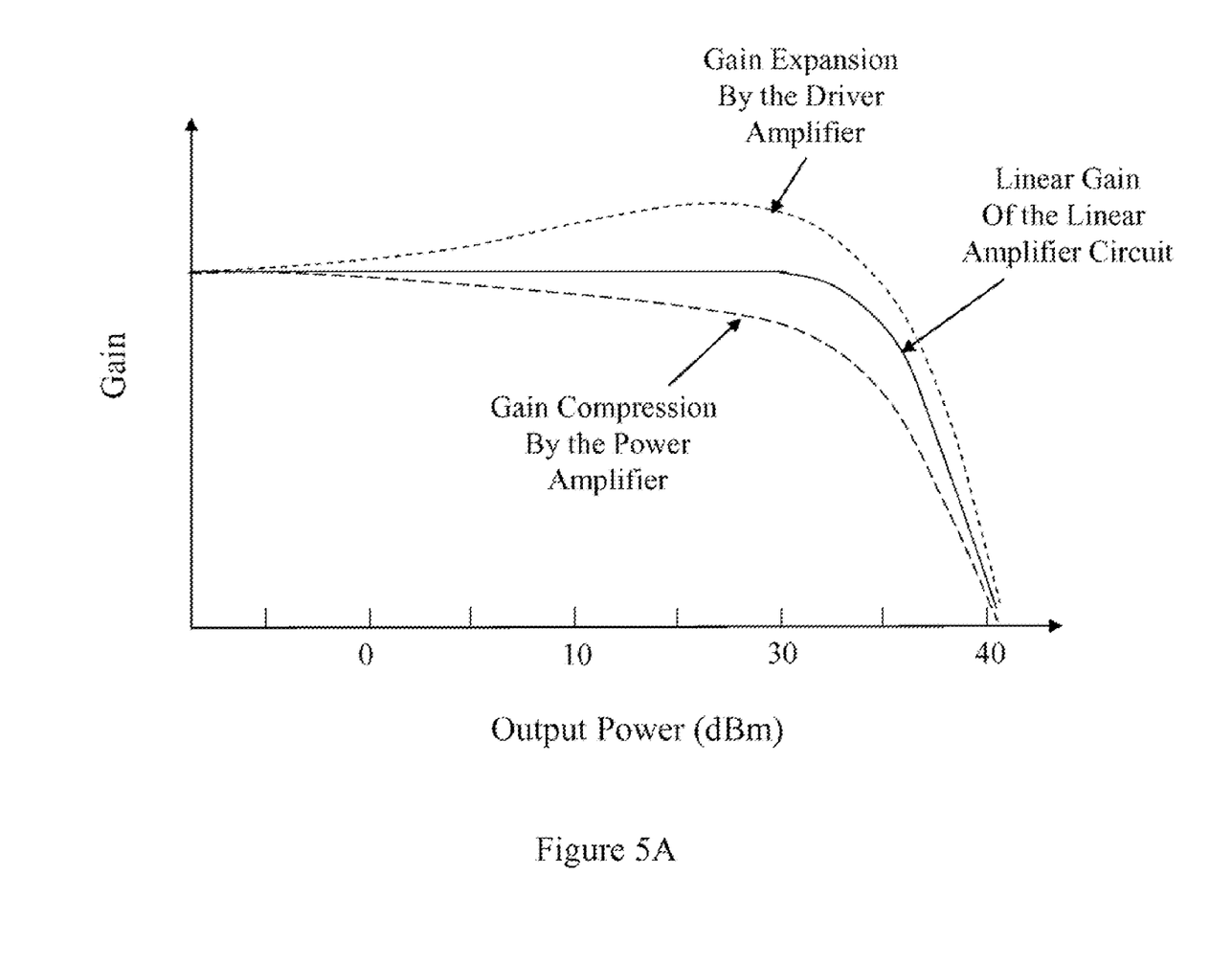
FIG. 5A illustrates an implementation of achieving linear gain using gain compensation in the linear amplifier circuit of FIGS. 1-3.
Figure 5B:
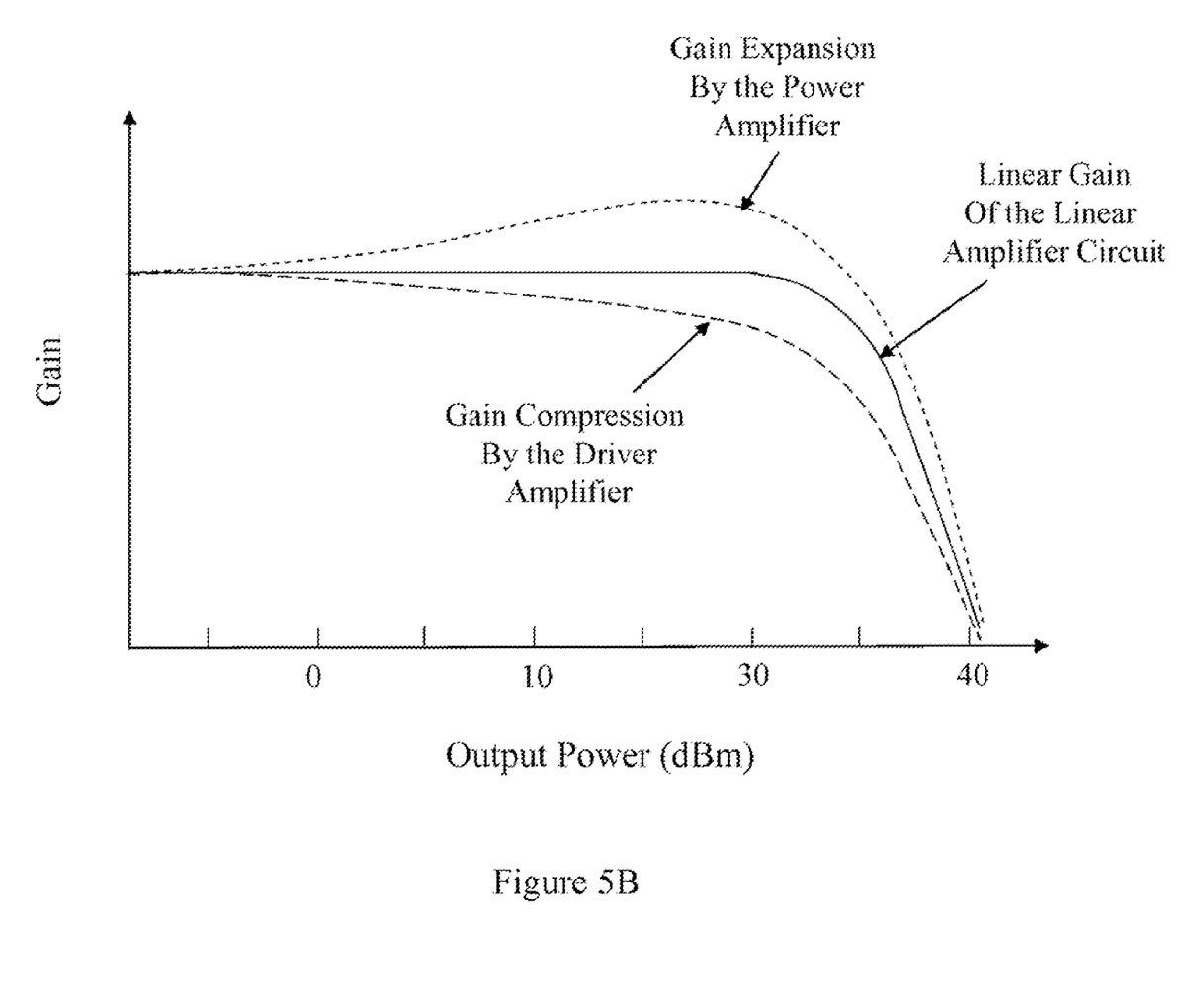
FIG. 5B illustrates another implementation of achieving linear gain using gain compensation in the linear amplifier circuit of FIGS. 1-3.

In another implementation, an improved and efficient linear amplifier circuit 300, referring to FIG. 3, includes a matching circuit 310 for the input signal and a power driving stage 315 that includes a power driver (PD) 320, a gain control circuit 325, and a phase control circuit 327. The gain control circuit 325 and the phase control circuit 327 receive control signals from a linearity controller that can be a base band processor (520 in FIG. 7 below) or a dedicated linearity control circuit. The gain control circuit 325 and the phase control circuit 327 can respectively provide gain and phase controls to the power driver 320. The power driver 320 is biased by a biasing circuit 329 that can be internal in the power driver 320. The linear amplifier circuit 300 also includes a power divider 331, a matching circuit 330 for matching the impedance of a first power divided signal from the power divider 331, and a matching circuit 335 for matching the impedance of a second power divided signal from the power divider 331. The linear amplifier circuit 300 also includes a main power amplifier 340 and an auxiliary power amplifier 345 which can be arranged in a parallel circuit, matching circuits 360, 365 respectively for matching the amplified signals from the main power amplifier 340 and the auxiliary power amplifier 345. The main power amplifier 340 and the auxiliary power amplifier 345, as described below, can coordinate the amplification tasks. The main power amplifier 340 can amplify the output from the matching circuit 330 to produce a first amplified signal. The auxiliary power amplifier 340 can amplify the output from the matching circuit 335 to produce a second amplified signal. The matching circuit 360, 365 can respectively match the impedances of the first amplified signal and the second amplified signal. A matching and power combining circuit 370 can combine the powers and further match the impedances of the output signals from the matching circuits 360, 365. As discussed below in relation to FIG. 7 and a wireless communication device 500, a sensing circuit 516 can receive the output signal from the matching circuit 370, which can detect the power, the gain, and the phase of the output signal for linearity control.

Figure 6A:
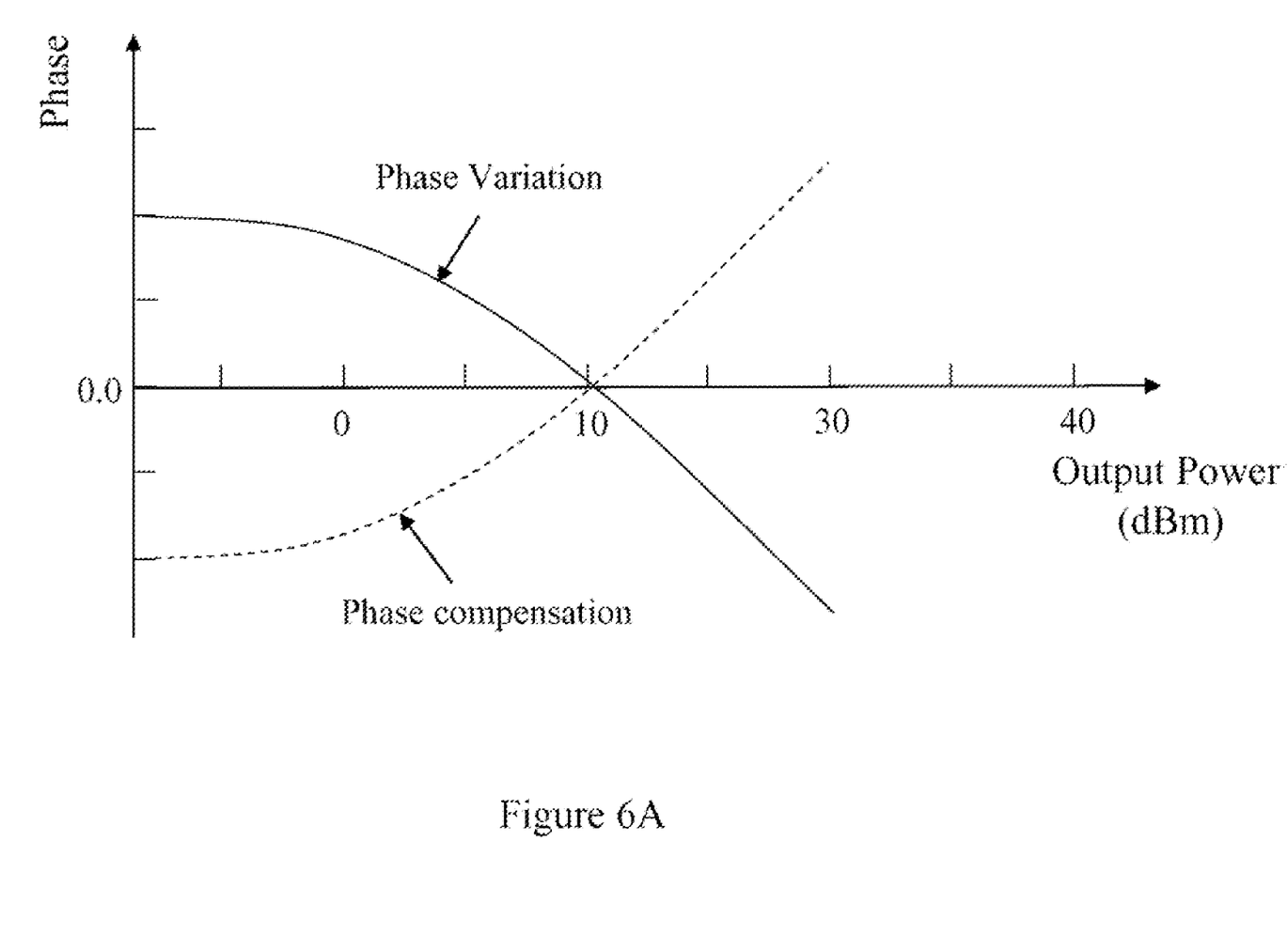
FIG. 6A illustrates an implementation of achieving linearity using phase compensation in the linear amplifier circuit of FIGS. 1-3.
Figure 6B:
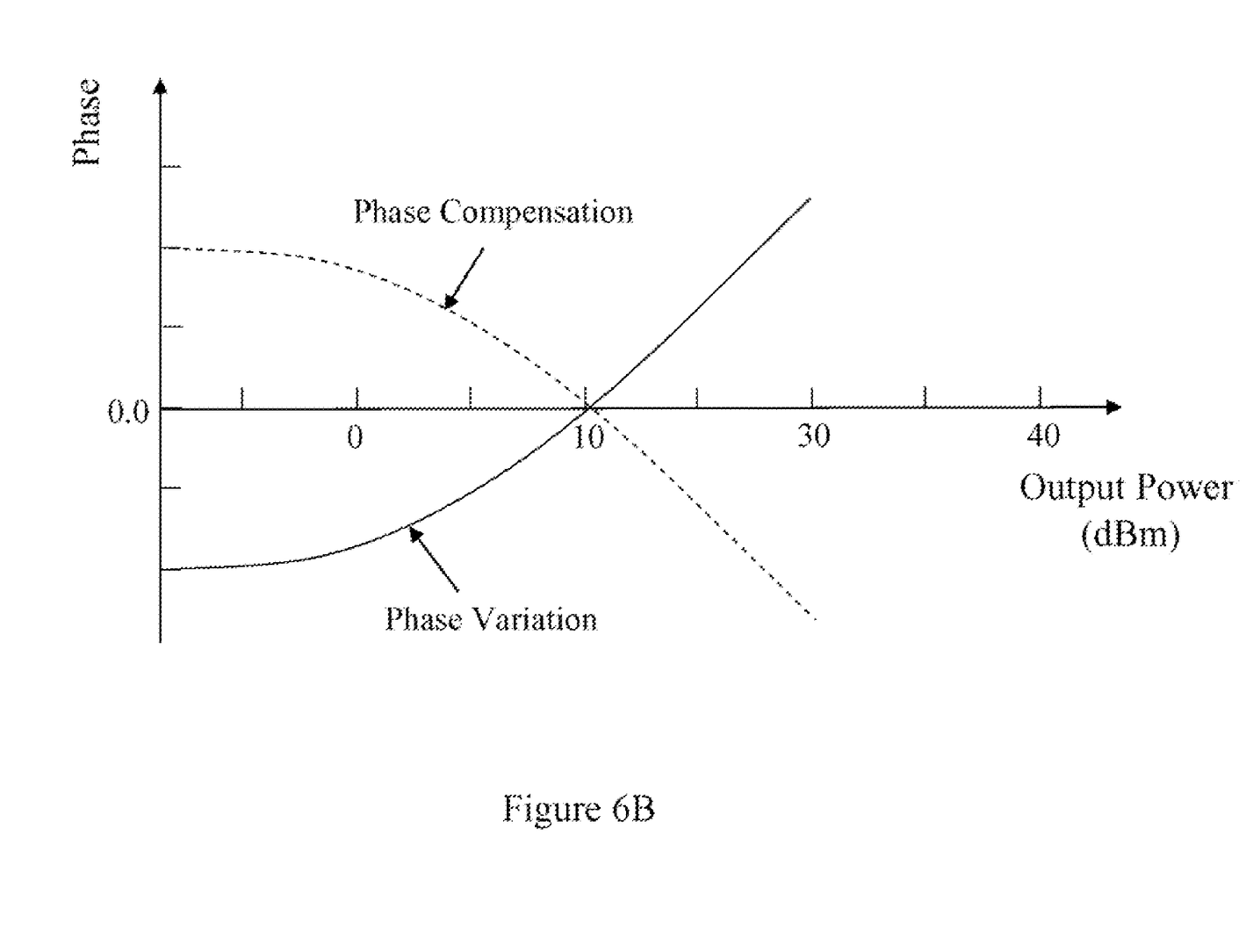
FIG. 6B illustrates another implementation of achieving linearity using phase compensation in the linear amplifier circuit of FIGS. 1-3.

As discussed below in relation with FIGS. 6A and 6B, the gain control circuit 327 can improve gain linearity by compensating the gain expansion and compression between the power driver 320 and the main power amplifier 340 and the auxiliary power amplifier 345. The phase control circuit 325 can correct or compensate for phase variations over a range of the output power.

The impedance matching of the input and output signals is preferably based on the 50-ohm standard of the RF industry. Other details of impedance matching circuits are described commonly assigned U.S. patent application Ser. No. 10/041,863, filed on Oct. 22, 2001, titled "Multilayer RF Amplifier Module", by Wang, et al., the content of which is incorporated by reference.

A biasing circuit 350 can provide bias voltages the main power amplifier 340 and the auxiliary power amplifier 345. As described below in more detail in relation to FIG. 7, the biasing circuit 350 can be controlled by a control logic circuit and/or a Vmode control circuit. The controls can be determined by the power of the output RF signal as sensed by a power sensing circuit, or by a base band processor.

An advantage of the improved and efficient linear amplifier circuit 300 is that it includes separate impedance matching for the intermediate signals before and after the main power amplifier 340 and the auxiliary power amplifier 345. A separate matching circuit is provided to match the impedance of the output RF signal. A power divider is provided to properly distribute power to the main power amplifier 340 and the auxiliary power amplifier 345. Since the main power amplifier 340 and the auxiliary power amplifier 345 can operate with high current flowing, non-zero impedance can induce can inject unwanted voltage noise during the intermediate amplification steps in the linear amplifier circuit. The impedance matching for the intermediate signals can therefore significantly minimize noise and unwanted signal oscillations.

It should be noted that the main power amplifier 340 and the auxiliary power amplifier 345 can include multiple stages of amplifiers. Moreover, the power amplifier module 300 can include more than one auxiliary power amplifiers 345. For example, the power amplifier module 300 can include two or three auxiliary power amplifiers that are connected in parallel with the main power amplifier. The different auxiliary power amplifiers can be activated at and below different threshold power levels of the output signal. In some embodiments, the power amplifier module 300 is fabricated on an integrated circuit (IC) module that can be implemented on a single semiconductor chip. In some embodiments, the power amplifier module 300 is fabricated on an integrated circuit (IC) module that can be implemented on a single semiconductor chip.

In accordance with the present specification, the main power amplifier (e.g. 240 or 340) and the auxiliary power amplifier (e.g. 245 or 345) can be fabricated and controlled in accordance to the probability distribution of the output power in wireless communication devices that incorporates the linear amplifier circuit (e.g. 200 or 300). FIG. 3 illustrates an exemplified probability distribution for output power of a wireless communication protocol in a geographic environment. The probability for output power is peaked at a certain output power value and falls off above and below the peak output power. The exact value of the peak output power and the shape of the fall-off curves depend on the wireless communication protocol as well as the geographic environment such as an urban area or a rural area.

The main power amplifier (e.g. 240 or 340) can be fabricated in large dimensions such that It can handle the amplification of high power output. The auxiliary power amplifier (e.g. 245 or 345) on the other hand can be fabricated in smaller dimensions to allow it to handle the amplification of low power signals. The main power amplifier (e.g. 240 or 340) can be activated by the biasing circuit, (e.g. 250 or 350) when the output signal is at high power. The auxiliary power amplifier (e.g. 245 or 345) can be activated by the biasing circuit, (e.g. 250 or 350) when the output signal is at low power. The output power, as described above and more in detail below, can be measured by a power sensing circuit. The power sensing signal produced by the power sensing circuit can be directly fed to control the biasing circuit, or to a base band processor that can determine the proper control to biasing circuit based on the calculation of the power level and other quality factors of the output RF signal.

The auxiliary power amplifier (e.g. 245 or 345) generally consumes much less power than the main power amplifier (e.g. 240 or 340). Because the main power amplifier (e.g. 240 or 340) can be turned off when the output power is at low level, the power consumption can be significantly decreased for the wireless communication device.

In accordance with the present specification, the main power amplifier (e.g. 240 or 340) and the auxiliary power amplifier (e.g. 245 or 345) can be fabricated to optimize power management performance specific to the geographic environment. For example, if a wireless communication device such as a cellular phone is to be used in the Asian market, the functionalities of the main power amplifier (e.g. 240 or 340) and the auxiliary power amplifier (e.g. 245 or 345) can be tailored to the specific probability distribution for output power in the Asian market. For example, if a geographic market includes higher density of wireless transmission base stations which requires of lower output power, the main power amplifier can be tailored to smaller dimensions. The geographic markets can also include suburban versus urban applications. For example, the main power amplifier and the auxiliary power amplifier can be fabricated with a size ratio in a range between 1:1 and 100:1, such as approximately 7:1, which can cover power ranges differing by about 5 dB.

In some embodiments, the disclosed linear power amplifying circuits 100, 200, and 300 can improve gain linearity using gain compensation. Referring to FIGS. 1-3 and 5A, the power driver 120, 220, or 320 can perform gain expansion. The power amplifier 140, or the main power amplifier 240 or 340 and the auxiliary power amplifier 245 (or 345) can perform gain compression. The combined effects of the gain expansion and gain compression allow the linear amplifier circuit 100, 200, or 300 to achieve gain linearity in a wide range of output power. Alternately, referring to FIGS. 1-3 and 5B, the power driver 120, 220 or 320 can perform gain compression. The power amplifier 140, or the main power amplifier 240 or 340 and the auxiliary power amplifier 245 or 345 can perform gain expansion. The combined effects of the gain expansion and gain compression allow the linear amplifier circuits 100, 200 or 300 to achieve gain linearity in a wide range of output power.

In some embodiments, the disclosed linear power amplifying circuits 100, 200, and 300 can improve gain linearity using phase compensation or correction. Referring to FIGS. 1-3 and 6A, the phase of the amplified signal of the power amplifying circuits 100, 200, and 300 can vary over a range of the output power. Specifically the phase is shown to decrease with an increase in the output power. The phase control circuits 127, 227, and 327 can produce phase-compensation signals that increase with the output power. The phase-compensation signals are respectively sent to the power driver 120, 220, or 320 to compensate the phase variations. Similarly, referring to FIG. 6B, the phase of the amplified signal of the power amplifying circuits 100, 200, and 300 can increase with an increase in the output power. The phase control circuits 127, 227, and 327 can produce phase compensation signals that decrease with the output power. The phase compensation signals are respectively sent to the power driver 120, 220, or 320 to compensate the phase variations.

In some embodiments, the phase of the amplified signal from the power amplifying circuits 100, 200, and 300 can both increase and decrease as a function of the output power. Phase compensation can be generated, to dynamically compensate over each segment of the output power. The phase compensation can be dependent on the magnitude, the polarity, and the rate of change in the phase variations.

The power amplifier 140, or the main power amplifier 240 or 340 and the auxiliary power amplifier 245 (or 345) can perform gain compression. The combined effects of the gain expansion and gain compression allow the linear amplifier circuit 100, 200, or 300 to achieve gain linearity in a wide range of output power. Alternately, referring to FIGS. 1-3, and 5B, the power driver 120, 220 or 320 can perform gain compression. The power amplifier 140, or the main power amplifier 240 or 340 and the auxiliary power amplifier 245 or 345 can perform gain expansion. The combined effects of the gain expansion and gain compression allow the linear amplifier circuits 100, 200 or 300 to achieve gain linearity in a wide range of output power.

Figure 7:
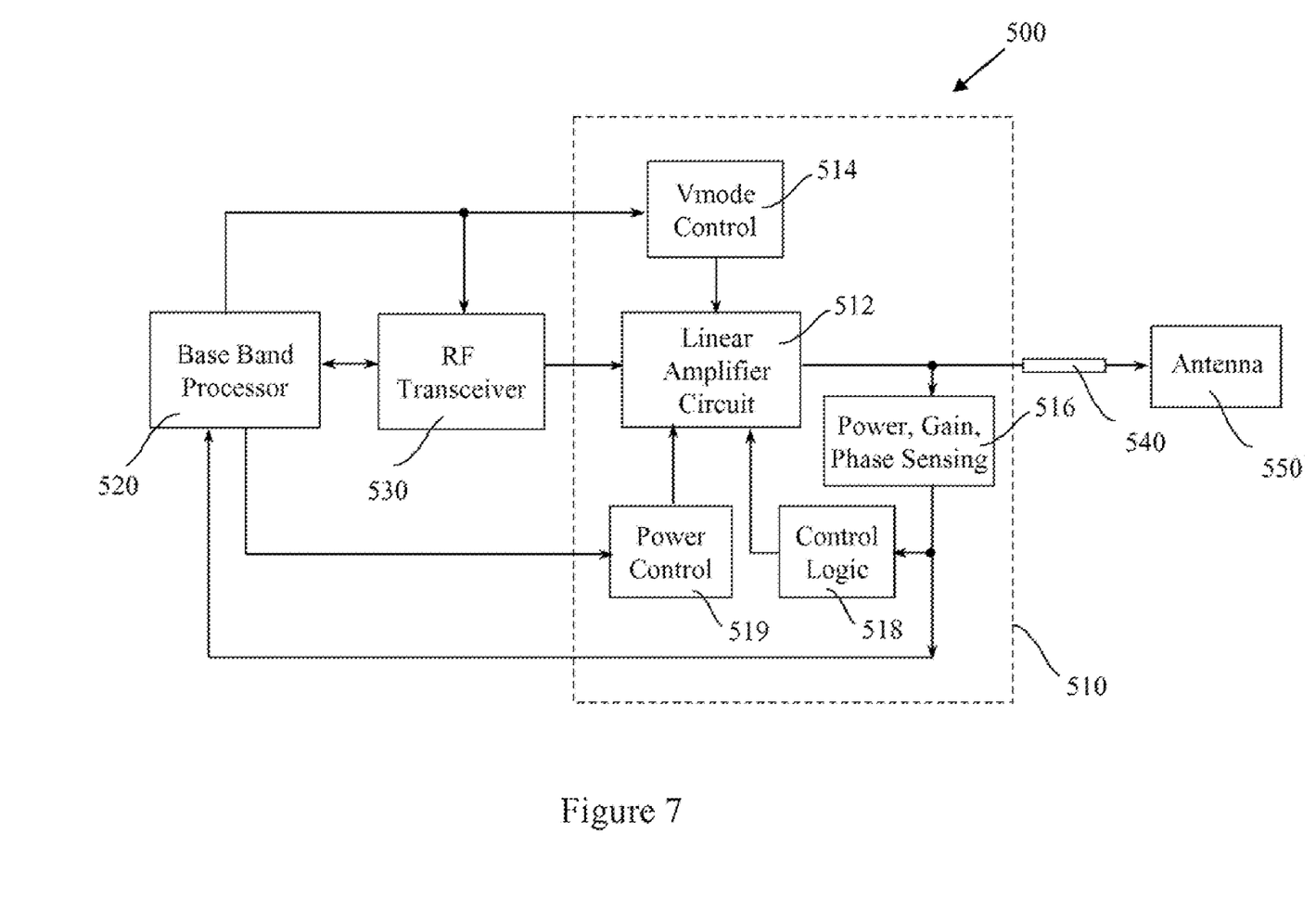
FIG. 7 illustrates an exemplified implementation of the efficient linear amplifier circuit in a wireless communication device in accordance with the present specification.

FIG. 7 illustrates an exemplary application of a linear amplifier circuit 512 in a wireless communication device 500. The wireless communication device 500 can for example be a PDA, a WLAN adaptor, or a cellular phone. The linear amplifier circuit 512 can be implemented by the linear amplifier circuit 200 or 300 as previously described. The wireless communication device 500 can include a base band processor core 520, a RF transceivers 530, a power amplifier module 510, and a 50-ohm impedance transmission line or micro strip 540 and an antenna 550. The power amplifier module 510 can include the linear amplifier circuit 512, a Vmode control circuit 514, a sensing circuit 516 for detecting the power, the gain, and the phase of the output signal, a control logic circuit 518, and a power control circuit 519. The power amplifier module 510 can therefore amplify input RF signals by via close-loop control. In some embodiments, the power amplifier module 510 is fabricated on an integrated circuit (IC) module that can be implemented on a single semiconductor chip.

The base band processor 520 can generates digitally modulated signals. The frequency is up-converted by the RF transceiver 530 to a RF signal suitable for transmission. The RF signal is amplified by the PA module 510 that produces amplified RF signal for transmission by the antenna 550. The PA module 510 can be turned ON/OFF by the power control signal produced by the power control circuit 519.

In some embodiments, the linear amplifier circuit 512 can be controlled by an open loop by the base band processor 520 via Vmode control circuit 514. The Vmode control circuit 514 can produce a Vmode control signal to control and internal settings of the biasing circuits (e.g. 250 or 350) under the control of the base band processor 520. The base band processor 520 has the knowledge of the digital signal modulation type and the linear output requirement. For example, when the device is transmitting at high power, the Vmode control signal can control the biasing circuit to activate the main power amplifier. When the device is transmitting at low power, the Vmode control signal can control the biasing circuit to activate the auxiliary power amplifier. As a result, power consumption and output distortion can be minimized.

To provide excellent output linearity, a power amplifier must maintain a constant gain (which is defined as the ratio of the output signal power level to the input signal power level) over a wide output range. However, the power amplifier can be driven close to saturation at high output power level, which makes it difficult to maintain a constant gain. The quality of digital communication, especially the quality degrades at high output power level, can commonly be measured by Error Vector Magnitude (EVM), Bit Error Rate (BER), Packet Error Rate (PER), and Adjacent Channel Power Ratio (ACPR).

In some embodiments, the linear amplifier circuit 512 can be controlled by a close loop by the power sensing circuit 516. The output linearity can be improved by a feedback control based on the sensing of the output power level. The power sensing circuit 516 can measure the power of the output RF signal and send a power sensing signal to the base band processor 520. The base band processor 520 can set the transmission power level by varying the input signal to the RF transceiver 530 and thus to the PA module 510 in accordance to the power sensing signal received by the power sensing circuit 516. The control logic circuit 518 can process the power-sensing signal from the power sensing circuit 516 and compute a quality or a magnitude of the output signal. A power-sensing control signal is then generated to control the biasing circuit 250 and 350 in response to the quality, or the magnitude, or a combination thereof, of the output signal. Other details of the power sensor circuit are disclosed in commonly assigned U.S. patent application Ser. No. 10/385,059 tilted "Accurate Power Sensing Circuit for Power Amplifiers" filed Mar. 9, 2003, by Ichitsubo et al., the disclosures of which related application are incorporated, herein by reference.

The control logic circuit 518 can receive and process the power-sensing control signal, and output a processed power-sensing control signal to control the linear amplifier circuit 512. The processed power-sensing control signal can be a function of the quality and/or the magnitude of the amplified radio frequency signals from the linear amplifier circuit 512. The control logic circuit 518 can improve output linearity of the linear amplifier circuit 512 by adjusting the bias of the biasing circuits (e.g. 250 or 350) in accordance to the actual output power measured by the power sensing circuit 516. It can reduce gain saturation and maintain a more constant gain, which can improve the output linearity in a wide power range. Furthermore, the quality of digital communication can also be improved by an external controller that can adjust the amplitude of the input RF signal based the known relationship between digital communication quality and output power level.

The PA module 510 can be implemented as an integrated circuit on a common semiconductor substrate which can be a multiplayer printed circuit board (PCB), lead frame, lowertemperature co-fired ceramics (LTCC), or other suitable electronic materials. The substrate includes metal Pins adapted to receive connecting terminals of integrated circuits including the first stage power amplifier, the main and the auxiliary power amplifiers, the biasing circuit, power sensing circuit, Vmode control circuit, and optional control logic circuit. The amplifier IC chip can include electrically conductive layers and patches for proper grounding and cooling of the PA module 510.

The PA module provides a unitary or common component which may be conveniently assembled in a RF transmission device, with correspondingly simplified assembly, compact 3D size, and enhanced RF amplification performance. In accordance with the present invention, the term "module" refers to such a unitary device for wireless communications, comprising integrated power amplifiers and other circuitry and auxiliary electronic components. The disclosed PA module can be applied to a wide range wireless communication devices such as cellular phone, mobile computers, and hand-held wireless digital devices. The PA module has a miniature size of a few millimeters. Other details about power amplifier modules are disclosed in commonly assigned U.S. patent application Ser. No. 11/486,465 tilted "Thermally distributed integrated power amplifier module", filed Jul. 16, 2006, by Ichitsubo et al., the disclosures of which related application are incorporated herein by reference.

It is understood the disclosed linear amplifier circuits can be compatible with other variations without deviating from the spirit of the present application. For example, each power amplifier in the linear amplifier circuit can include more than three or more power amplifiers having different gain factors for amplifying RF signals in different output power ranges. Three or more power amplifiers can be arranged in a parallel circuit after a first-stage power amplifier. The linear amplifier circuit can include one, or two, or more stages of power amplification. The gain and phase response curves and the output power ranges shown in disclosed figures are meant to be illustration purposes. The disclosed systems and methods are suitable to other gain and phase response characteristics in different power ranges.

The disclosed linear amplifier circuits are suitable to applications in various wireless data and voice communications standards and protocols, including Orthogonal Frequency-Division Multiplexing (OFDM), Orthogonal Frequency-Division Multiplexing Access (OFDMA), Code Division Multiple Access (CDMA), Wideband Code Division Multiple Access (WCDMA), High-Speed Downlink Packet Access (HSDPA), High-Speed Packet Access (HSPA), Ultra Mobile Broadband (UMB), Long Term Evolution (LTE), WiMax, WiBro, WiFi, WLAN, 802.16, and others. The disclosed linear amplifier circuits are also suitable for high frequency operations by utilizing Gallium Arsenide Heterojunction Bipolar Transistors (GaAs HBT).

What is claimed is:

1. A linear amplifier circuit, comprising:
a first matching circuit configured to receive a first signal and to produce a first impedance matched signal;
a first power amplifier coupled to the first matching circuit, wherein the first power amplifier is configured to produce a first amplified signal in response to the first impedance matched signal under the control of a first bias signal;
a second power amplifier coupled to the first matching circuit, wherein the second power amplifier is configured to produce a second amplified signal in response to the first impedance matched signal under the control of a second bias signal;
a biasing circuit configured to produce the first bias signal and the second bias signal, wherein the first power amplifier is configured to be activated by the first biasing signal when the power of the output signal is to exceed a first threshold value, wherein the second power amplifier is configured to be activated by the second biasing signal when the power of the output signal is below a second threshold value;
a second matching circuit configured to receive the first amplified signal and the second amplified signal, and to produce an output signal
a third matching circuit configured to receive an input signal and to produce a second matched impedance signal in response to the input signal;
a driver amplifier configured to amplify the second impedance matched signal to produce the first signal;
a phase control circuit in communication with at least one of the driver amplifier, the first power amplifier and the second power amplifier, wherein the phase control circuit is configured to control variations in the phase of the driver amplifier, the first power amplifier and the second power amplifier in an output power range; and
a gain control circuit in communication with at least one of the driver amplifier, the first power amplifier and the second power amplifier, wherein the gain control circuit is configured to control variations in gains of the driver amplifier, the first power amplifier and the second power amplifier in an output power range.

2. The linear amplifier circuit of claim 1, wherein the first bias signal is configured to activate the first power amplifier when the power of the output signal is to exceed the first threshold value and to deactivate the first power amplifier when the power of the output signal is below the first threshold value.

3. The linear amplifier circuit of claim 1, wherein the biasing circuit is configured to produce the first bias signal and the second bias signal in accordance to the power of the output signal.

4. The linear amplifier circuit of claim 1, further comprising a third power amplifier coupled to the first matching circuit, wherein the third power amplifier is configured to produce a third amplified signal in response to the first impedance matched signal under the control of a third bias signal received from the biasing circuit.

5. The linear amplifier circuit of claim 4, wherein the first power amplifier is configured to be activated when the power of the output signal is below a third threshold level lower than the second threshold value.

6. The linear amplifier circuit of claim 1, further comprising a power sensing circuit configured to measure the power of the output signal and to send a power sensing signal to the biasing circuit.

7. The linear amplifier circuit of claim 1, wherein the first power amplifier and the second power amplifier are connected in a parallel circuit.

8. A linear amplifier circuit, comprising:
a driver amplifier configured to amplify an input signal to produce a first amplified signal;
a power amplifier configured to produce a second amplified signal in response to the first amplified signal under the control of a first bias signal;
a biasing circuit configured to produce the first bias signal; and
a gain control circuit in communication with at least one of the driver amplifier and the power amplifier, wherein the gain control circuit is configured to control gain expansion and gain compression of the driver amplifier and the power amplifier to compensate each other in an output power range thereby minimizing gain variations in the second amplified signal relative to the input signal in the output power range.

9. The linear amplifier circuit of claim 8, wherein the driver amplifier exhibits gain expansion in the output power range and wherein the power amplifier exhibits gain compression in the output power range.

10. The linear amplifier circuit of claim 8, wherein the driver amplifier exhibits gain compression in the output power range and wherein the power amplifier exhibits gain expansion in the output power range.

* * * * *